(12) United States Patent
Barth et al.

(10) Patent No.: US 8,698,275 B2
(45) Date of Patent: Apr. 15, 2014

(54) ELECTRONIC CIRCUIT ARRANGEMENT WITH AN ELECTRICAL FUSE

(75) Inventors: Hans-Joachim Barth, München (DE); Andreas Rusch, Hohenbrunn (DE); Klaus Schrüfer, Baldham (DE)

(73) Assignee: Infineon Technologies AG, Munich (DE)

( * ) Notice: Subject to any disclaimer, the term of this patent is extended or adjusted under 35 U.S.C. 154(b) by 265 days.

(21) Appl. No.: 11/526,484

(22) Filed: Sep. 25, 2006

(65) Prior Publication Data

US 2007/0063313 A1    Mar. 22, 2007

Related U.S. Application Data

(63) Continuation of application No. PCT/DE2005/000541, filed on Mar. 24, 2005.

(30) Foreign Application Priority Data

Mar. 26, 2004 (DE) .......... 10 2004 014 925

(51) Int. Cl.
   *H01L 29/00* (2006.01)
(52) U.S. Cl.
   USPC ................... 257/529; 257/E23.149
(58) Field of Classification Search
   USPC ............. 257/529, 209, E23.149, E21.592
   See application file for complete search history.

(56) References Cited

U.S. PATENT DOCUMENTS

| | | | |
|---|---|---|---|
| 4,984,054 A | | 1/1991 | Yamada et al. |
| 5,949,127 A * | | 9/1999 | Lien et al. ............... 257/529 |
| 6,031,275 A * | | 2/2000 | Kalnitsky et al. ............ 257/530 |
| 6,033,939 A * | | 3/2000 | Agarwala et al. ............ 438/132 |
| 6,162,686 A * | | 12/2000 | Huang et al. ................ 438/281 |
| 6,252,292 B1 | | 6/2001 | Brintzinger et al. |
| 6,368,902 B1 | | 4/2002 | Kothandaraman et al. |
| 6,426,640 B1 | | 7/2002 | Wirth et al. |
| 6,440,834 B2 | | 8/2002 | Daubenspeck et al. |
| 6,750,129 B2 * | | 6/2004 | Yang et al. ................. 438/601 |
| 6,867,441 B1 * | | 3/2005 | Yang et al. ................. 257/209 |
| 2001/0008828 A1 * | | 7/2001 | Uchikura et al. ............. 451/41 |
| 2002/0014680 A1 * | | 2/2002 | Tottori ....................... 257/529 |
| 2002/0074618 A1 * | | 6/2002 | Marshall et al. ............. 257/529 |
| 2003/0062592 A1 | | 4/2003 | Santo et al. |
| 2003/0116820 A1 * | | 6/2003 | Daubenspeck et al. ....... 257/529 |
| 2003/0122200 A1 * | | 7/2003 | Kamiya et al. ............... 257/379 |
| 2004/0119138 A1 * | | 6/2004 | Yang et al. .................. 257/529 |
| 2004/0217439 A1 * | | 11/2004 | Li et al. ..................... 257/528 |
| 2005/0121755 A1 * | | 6/2005 | Shin et al. ................... 257/669 |
| 2005/0189613 A1 * | | 9/2005 | Otsuka et al. ............... 257/529 |
| 2005/0205965 A1 * | | 9/2005 | Yang ......................... 257/529 |
| 2005/0239273 A1 * | | 10/2005 | Yang ......................... 438/601 |

FOREIGN PATENT DOCUMENTS

| | | |
|---|---|---|
| DE | 19852429 C1 | 11/2000 |
| DE | 10026251 A1 | 12/2001 |
| EP | 0 853 341 A2 | 7/1998 |
| EP | 1 304 741 A1 | 4/2003 |

(Continued)

*Primary Examiner* — Selim Ahmed

(57) ABSTRACT

An electronic circuit arrangement has a substrate which has at least one metallization layer. At least one electrical interconnect and/or at least one via are formed in the metallization layer such that the electrical interconnect and the via are in the form of an electrical fuse link. In addition, the substrate has electrical circuit components which are arranged in the circuit layer. The circuit components are electrically coupled to one another by means of the electrical interconnect and by means of a plurality of vias.

16 Claims, 4 Drawing Sheets

(56) References Cited  * cited by examiner

FOREIGN PATENT DOCUMENTS

| | | |
|---|---|---|
| GB | 2 245 099 A | 12/1991 |
| JP | 09-069607 | 10/1998 |
| JP | 11-224900 | 2/2001 |

Plan view:

Cross section:

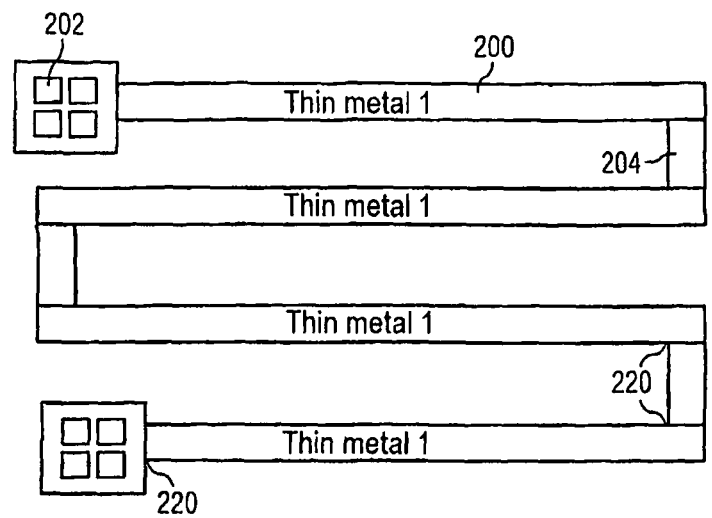
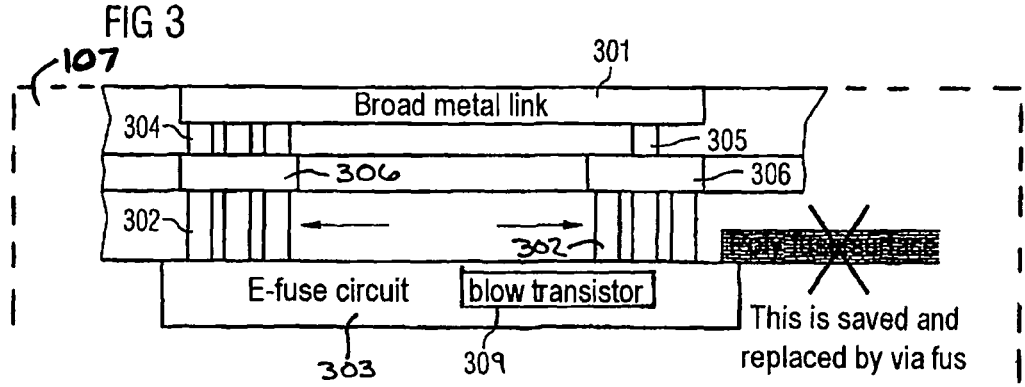

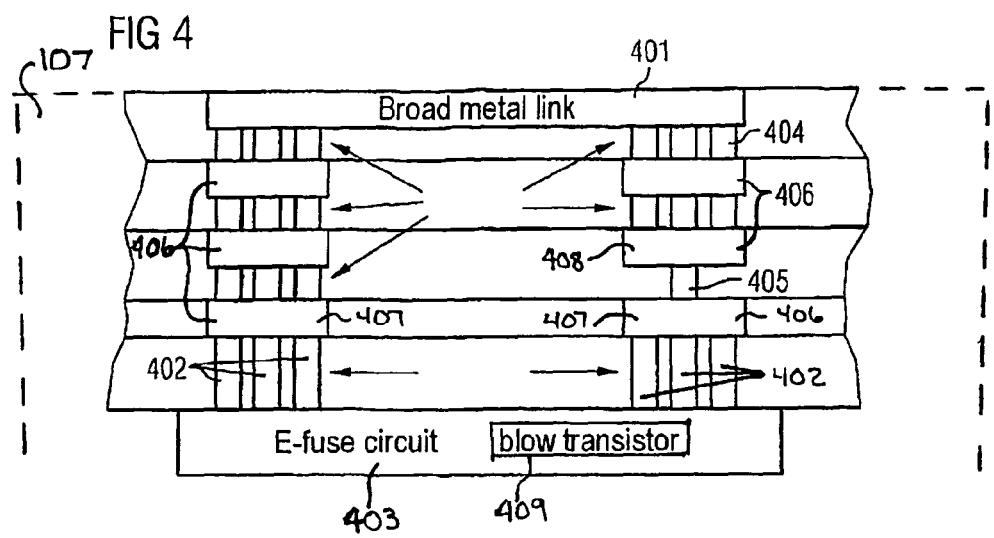
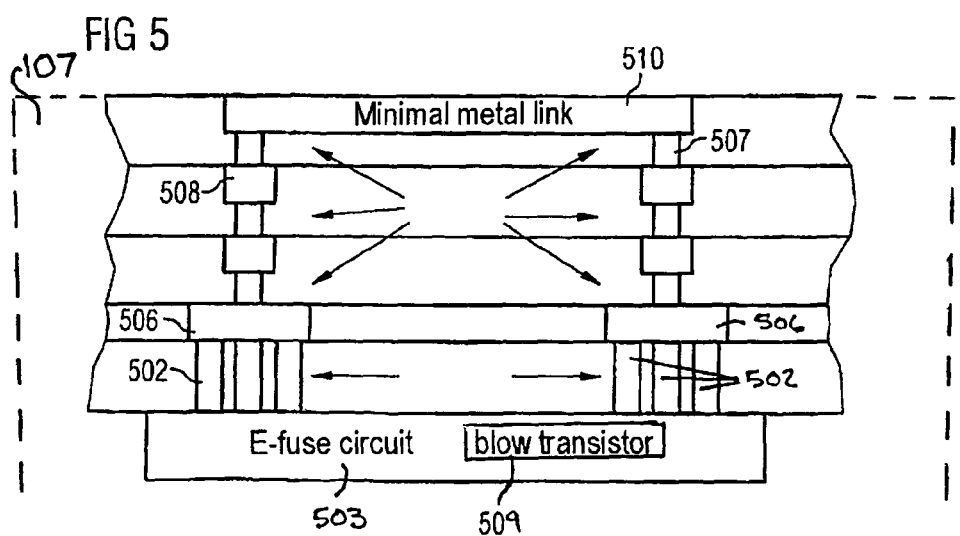

ELECTRONIC CIRCUIT ARRANGEMENT WITH AN ELECTRICAL FUSE

CROSS-REFERENCE TO RELATED APPLICATIONS

This application is a continuation of international application PCT/DE2005/000541, filed Mar. 24, 2005, which claims priority to German Patent Application No. DE 102004014925.9 filed Mar. 24, 2004, both of which are incorporated herein in their entirety by this reference.

BACKGROUND

1. Field of the Invention

The invention relates to an electronic circuit arrangement.

2. Description of Related Art

For conventional chip production strategies, it is normal, as described by way of example in U.S. Pat. No. 6,368,902 B1, to provide redundant components in integrated memories, in order to improve the yield of serviceable chips from the production process. The yield of integrated memories is increased significantly by the replacement of faulty cells by means of an additional circuit, which is provided as a redundant circuit on a respective chip. The additional circuits normally have contact made with them, and are thus activated or not activated, selectively, by means of electrically conductive links (referred to in the following text as electrical fuse links), by increasing the electrical resistance of a respective electrical fuse link, or by "burning through" the respective electrical fuse link. The yield of serviceable chips is increased by selective variation of the electrical resistance of the respective electrical fuse link within an integrated circuit, thus resulting in lower production costs for the production of the chips.

The electrical fuse link is taken into account in the design of the respective integrated circuit. The electrical fuse link is deliberately "burnt through", for example by means of an electric current flowing through the electrical fuse link, with the electrical current level being sufficient to open the electrical fuse link. Alternatively, a current which is weaker than that which is required to completely disconnect the electrical fuse link can be applied to the electrical fuse link, with the consequence that the electrical fuse link only partially degenerates, and the electrical resistance of the electrical fuse link is increased. This process of deliberate burning-through or degeneration of the electrical fuse link is also referred to as programming of the electrical fuse link.

In the electronic circuit arrangement, the electrical fuse link is preceded by an electronic component, and is supplied with current by means of a field-effect transistor in order to degenerate or finally cut through the electrical fuse link. The field-effect transistor is a transistor in which a control voltage which is applied to a high-impedance control electrode (gate) produces an electrical field in a current-carrying channel. This field effect influences the conductivity of the channel, whose connections are referred to as the source and drain.

The document U.S. Pat. No. 6,162,686 A discloses a structure for a fuse link composed of metal, in which the fuse link is melted by means of a laser beam which is directed at the fuse link. Tungsten is used as the fusible material.

The document EP 1 304 741 A1 discloses a fuse element with a polysilicon layer and contacts which are fitted to it at right angles. Metal lines are coupled to the contacts. Overlap areas of the contacts with the respective metal lines are designed such that electric current which flows through the metal lines melts the contact area between the contact and the respective metal line.

The document EP 853 341 A2 discloses a fuse link, which is cut through by means of a laser at the end of a metal track.

The document U.S. Pat. No. 6,440,834 B2 discloses the use of organic material as the fusible material in a fuse link.

Furthermore, the documents DE 100 26 251 A1 and DE 198 52 429 C1 disclose drive circuits for programming a fuse.

The disadvantage of an electrical fuse link as described above is that the electrical fuse link will occupy a significant area that may be utilized for other circuitry. Accordingly, it is preferable to provide an electronic circuit arrangement having electrical fuse links which occupy less space.

SUMMARY

The development of an electrically programmable fuse link has opened up the gateway to a large number of options. FIG. 6a shows, schematically, one configuration for an electrical fuse link. The electrical fuse link is formed from a polysilicon layer 611, a conductive layer 612 which is applied to the polysilicon layer, and from an additional covering layer 613. An electrical fuse link such as this based on polysilicon is also referred to in the following text as a polysilicon fuse link.

The polysilicon layer 611 is formed on an oxide layer 614, for example silicon dioxide or some other conventional oxides or other conventional isolators, and, depending on the application, has a thickness of 200 nm to 300 nm. The polysilicon layer 611 may be p-doped, n-doped or may have no doping, and has a surface resistance which is sufficient to prevent undesirable current flow after programming of the electrical fuse link. A resistance of more than 500 $\Omega$/area is required for this purpose.

The oxide layer 614 mentioned above, on which the polysilicon layer 611 is formed, is a so-called STI oxide (Shallow Trench Isolation Oxide). In this method, narrow trenches are etched in the semiconductor material. These trenches are filled with oxide, so that the electrical fuse links are electrically isolated from one another. The oxide layer has a thickness of 250 nm to 450 nm, that is to say a thickness which is sufficient to electrically isolate the electrical fuse link.

The conductive layer 612 which is formed on the polysilicon layer 611 is formed from a material with a low resistance, and which is also compatible with the environment of the polysilicon layer 611. The material from which the conductive layer 612 is formed may be a metal silicide, such as cobalt silicide, titanium silicide, tungsten silicide, tantalum silicide or platinum silicide. The conductive layer 612 has a typical thickness of 20 nm to 30 nm, with a surface resistance of less than 10 $\Omega$/area.

The covering layer 613 is normally formed from silicon nitride, and is arranged above the conductive layer 612.

This polysilicon fuse-link block is also enclosed overall in a boron-phosphorus-silicate glass 615 as the isolation layer, in order to electrically isolate the electrical fuse link from the electronic component.

Furthermore, two contacts, which are referred to as the anode 616 and the cathode 617, are formed on the polysilicon fuse-link block as shown in FIG. 6b. These are each formed directly at the two ends of the fuse-link connection 618, in order to provide an electrical link between the electrical fuse link and an external appliance or other components within the same electronic circuit arrangement. A fuse-link connection is formed between the anode 616 and the cathode 617. When the electrical fuse link is programmed by means of a sufficiently large current through the conductive layer 612, the conductive layer 612 preferably degenerates, and possibly melts, in this region. The melting is caused by an effect which is referred to as electromigration or stress migration. This effect is based on the fact that, when an electrical current flows through the electrical fuse link, the electrons of metal atoms can migrate out of their rest position in the conductive layer 612, which is composed of metal silicide, and the metal atoms in consequence "migrate" with the electrons. The metal atoms are therefore depleted at a point within the electrical fuse link, while this results in enrichment of metal atoms at another point within the electrical fuse link. Points at which depletion occurs have a high impedance, while points at which enrichment occurs have a low impedance. The electrical fuse link is "melted" at the high-impedance points, and the current flow collapses.

An electronic circuit arrangement has a substrate which has at least one metallization layer. At least one electrical interconnect and/or at least one via are formed in the metallization layer such that the electrical interconnect and the via are in the form of an electrical fuse link. In addition, the substrate has electrical circuit components which are arranged in the circuit layer. The circuit components are electrically coupled to one another by means of the electrical interconnect and by means of a plurality of vias.

Accordingly, the electrical circuit arrangement can be produced easily, and at low cost, and saves space.

The disadvantage, as described above, of the prior art is reduced by the new way in which the fuse links are implemented in a chip. In the case of the electrical fuse link, which comprises a polycrystalline silicon block, a "blow transistor" and decoder electronics, the polycrystalline silicon block including its supply lines occupies virtually 10% of the total area of the fuse link. The transistor with its lines occupies 85-90% of the area. This 10% of the area which is consumed by the polycrystalline silicon block is saved as a result of the novel capability to implement the fuse link within an electronic circuit arrangement.

One aspect of the invention can clearly be regarded as being that the fuse link is no longer formed in the polycrystalline silicon block, but in the metallization area, the interconnect. There are various exemplary embodiments of the implementation of the electrical fuse link in the metallization layer relating to this. For example, on the one hand, a thin interconnect can be provided which is designed and arranged as an electrical fuse link in the metal layer, or a single via between two interconnects in different metallization layers, which is at the same time used as a through-contact and electrical fuse link between the individual metal layers. The characteristics and advantages of the invention which have been described above as well as others will also be described in detail in the following text, in order to assist understanding.

The electrical interconnect and at least one of the vias are preferably enclosed in a low-k material.

Because of the use of low-k material, the heat dissipation is poor, and the desired failure by means of electromigration or stress migration is simplified. In particular, this allows deliberate programming of individual electrical fuse links.

A plurality of electrical contacts are preferably formed within the electrical circuit arrangement.

The interconnect is preferably formed with the vias and with the electrical contacts each essentially at right angles to one another.

This has the advantage that the current density is increased at the right angles, which form corners, thus simplifying programming, that is to say deliberate melting of the electrical fuse link by electromigration or stress migration.

A fuse-link drive circuit is preferably formed within the electronic circuit arrangement, and is coupled to at least one interconnect and/or to the via, in order to supply electric current.

The fuse-link drive circuit makes it possible to program the electronic circuit arrangement easily.

A transistor is preferably used to provide an electric current for the fuse-link drive circuit within the electrical circuit arrangement.

This has the advantage that this electric current results in an increase of the electrical resistance in the electrical fuse link, thus making it easier to program the electrical fuse link.

The electronic circuit arrangement preferably has a plurality of transistors.

The use of a plurality of transistors allows a plurality of electrical fuse links to be programmed easily.

In one development, a decoder circuit is provided for driving the transistor.

The use of a decoder circuit is one possible way to monitor the programming of the electrical fuse link in a simple manner.

A metallization layer is preferably formed in the electronic circuit arrangement, in which an electrical interconnect is provided in the form of an electrical fuse link, and is coupled by means of electrical contacts to the fuse-link drive circuit and to the transistor.

The electrical fuse link can thus be programmed quickly and easily.

The electronic circuit arrangement preferably has a substrate with a large number of metallization layers located one above the other.

The electronic circuit arrangement preferably has a large number of metallization layers located one above the other, with the electrical fuse link being formed in one metallization layer with a maximum resolution which can be achieved by the process.

The space requirement is thus small. Furthermore, the formation of the electrical fuse link with maximum resolution, that is to say such that it is physically very small, reinforces the electromigration or the stress migration, thus making it easier to program the electrical fuse link.

The electrical interconnects may be in the form of electrical fuse links with a meandering shape, and may be coupled to one another by means of vias.

The use of the meandering configuration makes it possible to overcome the so-called sheet length for electromigration.

With modern and future technology generations with metal widths and via diameters of less than 100 nm, minimal metal tracks and vias composed of copper or aluminum now have only a limited current carrying capacity. The current which is used for the electrical fuse link, of about 10 mA to 20 mA, should be sufficient in order to melt a single minimal interconnect or a minimal via by means of electromigration or stress migration, such that it is possible to produce a change in the electrical resistance, which can be detected sufficiently accurately by simple means. When using 65 nm, 45 nm and 32 nm technology with the corresponding via diameters of $\approx 0.1$ µm, $\approx 0.07$ µm and $\approx 0.05$ µm, the corresponding current densities for a fuse-link current of 10 mA are 1250 to 5000 mA/µm$^2$ per via. These current densities are higher by a factor of more than 100 than the maximum permissible direct-current densities of about 10 mA/µm$^2$ for copper metallizations (for example logic) or 2 mA/µm$^2$ for aluminum metallizations (for example dynamic RAMs (dynamic random access memories), DRAM).

Further objects, features and advantages of this invention will become readily apparent to persons skilled in the art after a review of the following description, with reference to the drawings and claims that are appended to and form a part of this specification.

BRIEF DESCRIPTION OF THE DRAWINGS

FIG. 2 shows a schematic plan view of an interconnect fuse link in a so-called meandering structure according to a second exemplary embodiment;

FIG. 3 shows a schematic cross section of a via fuse link in the via layer, with a broad interconnect and a minimal via according to a third exemplary embodiment;

FIG. 4 shows a schematic cross section of a via fuse link in the via layer, with a broad interconnect and a minimal via according to a fourth exemplary embodiment;

FIG. 5 shows a schematic cross section in the metal layer with a thin interconnect and a plurality of minimal vias according to a fifth exemplary embodiment;

DETAILED DESCRIPTION

A first exemplary embodiment of the invention will be explained with reference to FIG. 1a and FIG. 1b, in which a substrate 107 is provided with an electrical fuse link, which is formed in or on the substrate 107, in a metallization layer of a chip which is formed in the substrate 107.

Figure 1A:
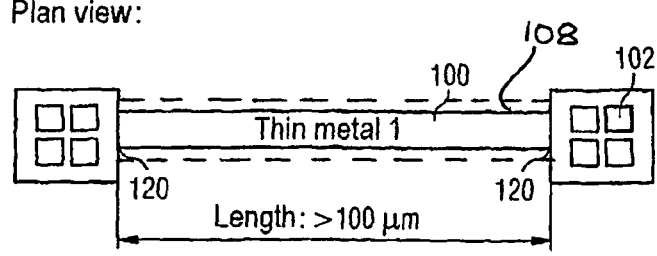
FIG. 1a shows a schematic plan view of an interconnect fuse link with electrical contacts according to a first exemplary embodiment.

FIG. 1a shows a plan view of an interconnect fuse link with a thin metal link 100 as an electrical fuse link. Contacts 102 are formed at each of the metal link 100, in order to make electrical contact. The metal link 100 has a length of at least 100 μm-200 μm, and has a width of less than 120 nm, preferably about 5 nm to 20 nm. This means that the metal link 100 is designed using $F^2$ such that this results in maximum resolution, with F being the minimum achievable one-dimensional structure size for the purposes of one technology generation. This design ensures that a failure caused by electromigration or stress migration can be achieved sufficiently quickly and to an adequate extent deliberately, by means of an electric current in the mA range. The metal link 100 is composed either of copper or aluminum, depending on the application, with aluminum being preferred for memory chips (DRAM), since the maximum permissible DC current density of 2 mA/μm² is less than that of copper (10 mA/μm²), so that aluminum melts at even lower current levels, which is advantageous for applications such as these. A copper metal link is preferably used for logic chips. The metal link 100 is considerably narrower than the electrical contacts 102, and is formed in the contact areas 120 in such a manner that essentially rectangular corners are formed. In the area of the right-angle corners, that is to say the area in which the current passes from the broad contact area 120 into the narrow metal link 100, there is an increase in the current density, the so-called "current crowding", which results in an increase in the "current crowding" at these points, that is to say the accumulation of material as described above. This means that high current densities occur at these points, which leads to greater heating and, associated with this, a greater failure probability, at least to a detectable increase in the electrical resistance of the metal link 100.

A material which is as resistant to heat as possible is used as the material for the contacts 102, which are formed at each of the ends of the metal link 100. The contacts 102 are preferably formed from tungsten, which has a melting temperature of 3683 degrees Kelvin, or of tantalum with a melting temperature of 3269 degrees Kelvin.

A cross section through the interconnect fuse link as described above will be described in the following text with reference to FIG. 1b, in which case the arrangement which is illustrated in FIG. 1a is in this case additionally coupled by means of the electrical contacts 102 in order to produce an electrical connection to the fuse-link drive circuit 103 and to a transistor 109, which is illustrated only schematically in FIG. 3. The transistor 109 supplies the fuse-link drive circuit 103 with a current of a magnitude which results in an increase in the electrical resistance in the electrical fuse link by virtue of electromigration or stress migration. The transistor is designed such that it can produce an mA current. Tungsten or tantalum is used as the material for the electrical contacts 102, which are formed at each of the ends of the metal link 100. Further, a decoder circuit 111 is provided to drive the transistor 103 that may take the form of a plurality of transistors.

Figure 1B:
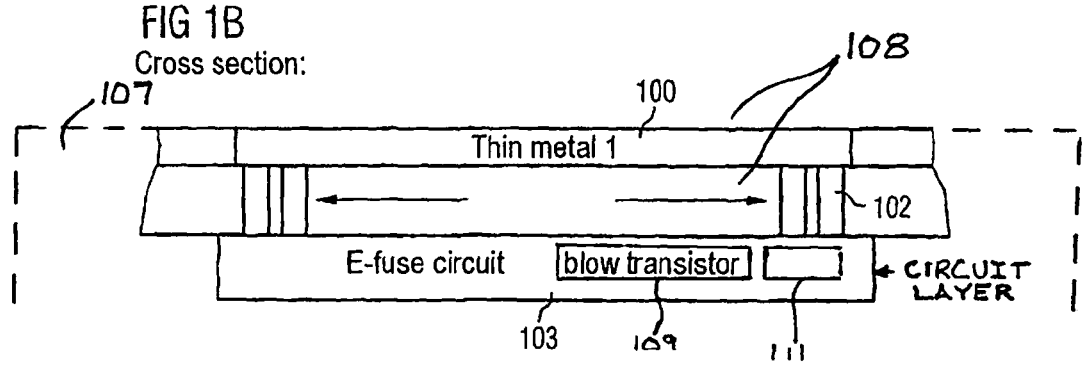
FIG. 1b shows a cross section through an interconnect fuse link in the metal layer of a chip with a thin interconnect and electrical contacts for the fuse-link drive circuit and a transistor.
Figure 6A:
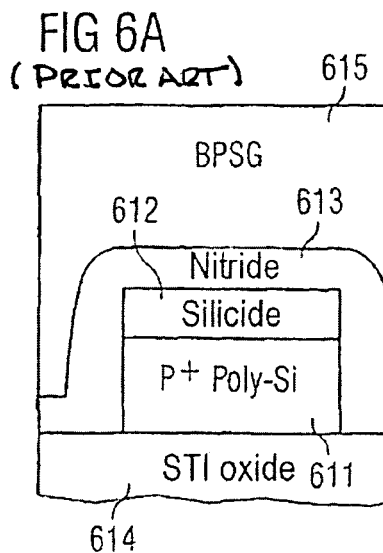
FIG. 6a shows a schematic cross section through an electrical fuse link according to the prior art.
Figure 6B:
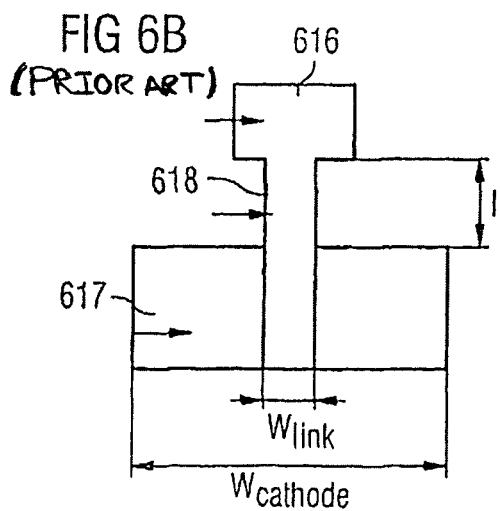
FIG. 6b shows a schematic plan view of an electrical fuse link according to the prior art.

The exemplary embodiment in FIG. 1b is preferably used in lower metallization layers, that is to say in those metallization layers in which the structures are manufactured with the maximum resolution based on the process technology being used (minimum feature size), in order to achieve current densities that are as high as possible there. High current densities result in the charge carriers, that is to say the electrons, and metal atoms, being able to be torn out of the metal composite with increased effect, and then to be carried away. This results in enrichment of metal atoms at one point and in depletion of metal atoms at another point. Those points at which the metal atoms have been depleted have a high impedance, where a hole is created through which current can no longer flow, that is to say the metal link 100 melts through at this point, and the failure probability is at its greatest here. This process is referred to as electromigration or stress migration, as described above.

In the first exemplary embodiment as shown in FIG. 1a and FIG. 1b, it is advantageous for the metal link 100 to be embedded in a low-k material as the dielectric, since the heat dissipation is then poor, and the electromigration failure or stress-migration failure is more probable. Low-k material is defined as a material with a low dielectric constant (k<4) and, associated with this, typically with poor thermal conductivity as well. The low-k material is schematically shown in FIG. 1a as reference numeral 108.

One such material with a low dielectric constant is, for example, SILK™. Alternatively, it is also possible to use organic materials, porous oxides or doped oxides. The organic materials may be polyimides, parylenes, etc. Examples of porous oxide include nanoglass or aerogels. Examples of doped oxides are nanoporous oxides and materials like silicon oxide doped with carbon (for example SiCOH, OSG (Organo Silicate Glass), Black Diamond™, Coral™, Aurora™).

FIG. 2 shows a schematic plan view of a second preferred exemplary embodiment of one implementation option, in which a metal link 200 is formed using a meandering structure with a large number of meander limbs arranged parallel to one another and alongside one another. In the second exemplary embodiment, the length of the metal link or of one limb is chosen such that it is greater than the so-called sheet length (>100 μm) for electromigration. In this case, a plurality of thin metal links 200 are coupled to one another by means of vias 204. Vias 204 are plated-through holes which couple lines, as well as metallization levels in different layers, to one another. The metal links are designed such that maximum resolution is ensured, that is to say that a failure by electromigration or stress migration is sufficiently probable. The electrical contacts 202 are now no longer formed at the ends of an individual metal link 200 but at each end of that metal link 200 which clearly forms the start of the meandering structure, and at one end that metal link 200 which clearly forms the end of the meandering structure. The metal links 200 are considerably narrower than the contacts 202 and the vias 204, and are formed in the contact areas 220 in such a manner that they essentially form a right angle, in order to increase the "current crowding". This results in higher current densities, which lead to greater heating and, associated with this, to a higher failure probability. The metal link 200 and the vias 204 are formed from copper or aluminum, depending on the application. The copper version is chosen specifically for logic chips, and the aluminum version for memory chips (DRAM). The electrical contacts 202 are composed of heat-resistant material such as tungsten or tantalum.

A third preferred exemplary embodiment of the implementation option according to the invention will be described in the following text.

FIG. 3 describes a via fuse-link embodiment in the form of a multilayer version within the metallization layer. In this arrangement, a single fuse-link via 305 is formed as the electrical fuse link. A metal link 301 in this embodiment is designed to be broader than the metal link 200 in FIG. 1a, FIG. 1b and FIG. 2. This broad metal link 301 is used in the upper metallization layer and is in each case coupled to an interconnect 306 by means of a plurality of vias 304 at one of its ends, and by means of a single fuse-link via 305 at its other end. The interconnects 306 themselves are coupled by means of a plurality of electrical contacts 302 to a fuse-link drive circuit 303 and to a transistor 309, which are illustrated only schematically in FIG. 3. The transistor 309 produces a current through the fuse-link drive circuit 303 of such a magnitude that this results in an increase in the electrical resistance of the electrical fuse link. The transistor 309 is designed such that it can produce an mA current. The single-fuse-link via 305 which is formed between the broad metal link 301 and the interconnect 306 is designed such that failure by means of electromigration or stress migration can take place deliberately, adequately and quickly by means of an electric current in the mA range. The electrical contacts 302 are composed of a material which is as heat-resistant as possible, such as tungsten or tantalum. The broad metal link 301 is formed from copper or aluminum, depending on the application. The interconnects 306 are likewise formed from copper or aluminum, in the same way as the individual fuse-link via 305. The vias 304, which may be in the form of through-plating between the broad metal link 301 and the interconnect 306 located underneath it, may be formed from copper, aluminum or else from heat-resistant tungsten.

One implementation option based on a fourth exemplary embodiment will be described in the following text with reference to FIG. 3.

FIG. 4 illustrates a development of the fuse-link via embodiment illustrated in FIG. 3, in the form of a multilayer version within the metallization layer. In the fourth exemplary embodiment, the single fuse-link via 405 is in the form of a fuse link. A broad metal link 401 is coupled to in each case one layer sequence of interconnects 406 at each of its two ends by means of a plurality of vias 404. These interconnects 406 are in turn coupled to one another by means of a plurality of vias 404, with the individual fuse-link via 405 being formed between one of the two lowermost interconnects 407 and the interconnect 408 located directly above it. The two lowermost interconnects 407 in this arrangement are coupled by means of electrical contacts 402 to the fuse-link drive circuit 403 and to the transistor 409, which are illustrated only schematically in FIG. 3. The transistor 409 supplies the fuse-link drive circuit 403 with a current of such a magnitude that it results in an increase in the resistance of the electrical fuse link. The transistor 409 is designed in such a manner that it can provide an mA current. The individual fuse-link via 405, which is formed between one of the lowermost interconnects 407 and the interconnect 408 which is located above it, is in this embodiment designed such that a failure by means of electromigration or stress migration can be produced deliberately, adequately and quickly by means of electric current in the mA range. The broad metal link 401 is likewise used in the upper metallization layers. The material which is used for the electrical contacts 402 is preferably heat-resistant tungsten or heat-resistant tantalum. The materials used, and from which the other components such as the metal link 401, the vias 404 and the individual fuse-link via 405 are composed, in each case depend on the application of the electronic circuit arrangement. Applications, for example for logic chips, are preferably for the purposes of multilayer copper metallizations, in which both the metal link 401 and the interconnects 406, the vias 404 and the individual fuse-link via 405 are composed of copper. In the case of memory chip applications (DRAM), multiple layers of aluminum metallizations are preferably formed, in which the contacts 402 are formed from tungsten, and the broad metal link 401, the interconnects 406, the vias 404 and the individual fuse-link via 405 are each formed from aluminum. Alternatively, for the two applications mentioned above, the vias 404 may also be formed from tungsten.

A fifth preferred exemplary embodiment of the implementation option according to the invention will be described in the following text.

FIG. 5 describes a fuse-link via embodiment as a multilayer version within a plurality of metallization layers. In this fifth exemplary embodiment, a minimal metal link 510 is formed, that is to say a metal link which is formed with the maximum resolution, as well a plurality of minimal individual vias 507 as electrical fuse links. The minimal metal link 510 is coupled at each of its two ends to a layer sequence of minimal individual vias 507. The minimal individual vias 507 are in this case coupled to one another by means of minimal interconnects 508. The two lowermost minimal individual vias 507 in the layer are each coupled to interconnects 506, which are coupled by means of electrical contacts 502 to the fuse-link drive circuit 503 and to the transistor 509. Transistor 509 provides the fuse-link drive circuit 503 with a current of a magnitude which causes an increase in the resistance in the electrical fuse link. The transistor 509 is designed such that it can produce an mA current. The minimal individual vias 507 are designed such that a failure can be produced adequately, quickly and deliberately by means of electromigration or stress migration, by means of an electric current in the mA range. The materials which are used for the individual components of this exemplary embodiment depend on the technical application. The electrical contacts are composed, as above, of tungsten or tantalum, which are highly heat-resistant materials. A multilayer copper metallization is preferably formed for applications for logic chips, in which the minimal metal link 510, the minimal individual vias 507, the minimal interconnects 508 and the two lowermost interconnects 506 in the metal layer are composed of copper. A multilayer aluminum metallization is preferably formed for applications for memory chips (DRAM), that is to say the minimal metal link 510, the minimal individual vias 507, the minimal interconnects 508 and the two lowermost interconnects 506 in the metal layer are composed of aluminum.

In all cases of the exemplary embodiments, it is advantageous for the metal links 100, 200 and 510 and the individual fuse-link vias 305, 405 and 507, which are in the form of electrical fuse links within the electronic circuit arrangement, to be enclosed in a low-k material as the dielectric. This has the effect that the heat dissipation is poor, and that the electromigration or stress-migration failure is more probable. Furthermore, in this circuit arrangement, the geometry may be identical in a plurality of successive metallization layers.

As a person skilled in the art will readily appreciate, the above description is meant as an illustration of implementation of the principles this invention. This description is not intended to limit the scope or application of this invention in that the invention is susceptible to modification, variation and change, without departing from the spirit of this invention, as defined in the following claims.

We claim:

1. An electronic circuit arrangement having a substrate, the substrate comprising:
   a plurality of electrical interconnects in a single metallization layer, the electrical interconnects electrically connected to a circuit layer,
   wherein at least one of the electrical interconnects in the single metallization layer is in the form of an electrical fuse link preferentially programmable by applying a sufficiently large current to melt or degenerate the fuse link, and
   electrical circuit components, arranged in the circuit layer, which are electrically coupled to one another by means of the at least one electrical interconnect and by means of a plurality of vias.

2. The electronic circuit arrangement as claimed in claim 1, in which the at least one electrical interconnect and at least one of the plurality of vias are enclosed in a low-k material having a dielectric constant less than 4.

3. The electronic circuit arrangement as claimed in claim 1, which has a plurality of electrical contacts.

4. The electronic circuit arrangement as claimed in claim 3, in which the at least one interconnect is formed with the plurality of vias and with the plurality of electrical contacts each essentially at right angles to one another.

5. The electronic circuit arrangement as claimed in claim 1, further comprising a fuse-link drive circuit, which is coupled to the at least one interconnect or to at least one of the plurality of vias, in order to supply electric current.

6. The electronic circuit arrangement as claimed in claim 5, further comprising a transistor for provision of an electric current for the fuse-link drive circuit, with the electric current resulting in an increase in the electrical resistance in the electrical fuse link.

7. The electronic circuit arrangement as claimed in claim 6, which has a plurality of transistors.

8. The electronic circuit arrangement as claimed in claim 7, in which a decoder circuit is provided for driving the transistor.

9. The electronic circuit arrangement as claimed in claim 6, wherein the electrical interconnect, which is in the form of a fuse link, is coupled by electrical contacts to the fuse-link drive circuit and to the transistor.

10. The electronic circuit arrangement as claimed in claim 1, wherein the substrate comprises a large number of metallization layers located one above the other.

11. The electronic circuit arrangement as claimed in claim 1, in which the at least one electrical interconnect is a plurality of interconnects, which are in the form of a fuse link with a meandering shape, and are coupled to one another by the plurality of vias.

12. The electronic circuit arrangement as claimed in claim 1, in which at least one via in the form of an electrical fuse link programmable by a sufficiently large current for melting or degenerating the at least one via is provided.

13. The electronic circuit arrangement as claimed in claim 1, wherein the plurality of electrical interconnects are all formed of the same material.

14. An electronic circuit arrangement having a substrate, the substrate comprising:
   a plurality of electrical interconnects in a single metallization layer, the electrical interconnects electrically connected to a circuit layer, wherein at least one of the electrical interconnects in the single metallization layer is in the form of an electrical fuse link preferentially programmable by a sufficiently large current for melting or degenerating the at least one electrical interconnect,
   electrical circuit components, arranged in a circuit layer, which are electrically coupled to one another by means of the at least one electrical interconnect and by means of a plurality of vias,
   wherein the at least one electrical interconnect is enclosed in a low-k material having a dielectric constant less than 4,
   and a fuse-link drive circuit, coupled to the at least one interconnect, in order to supply electric current.

15. The electronic circuit arrangement as claimed in claim 14, further comprising a transistor for provision of an electric current for the fuse-link drive circuit, with the electric current resulting in an increase in the electrical resistance in the electrical fuse link.

16. The electronic circuit arrangement as claimed in claim 15, wherein the electrical interconnect, which is in the form of a fuse link, is coupled by electrical contacts to the fuse-link drive circuit and to the transistor.

* * * * *